United States Patent
Ida et al.

(10) Patent No.: US 10,187,041 B2
(45) Date of Patent: Jan. 22, 2019

(54) PSEUDO RESISTANCE CIRCUIT AND CHARGE DETECTION CIRCUIT

(71) Applicants: Murata Manufacturing Co., Ltd., Nagaokakyo-shi, Kyoto-fu (JP); Massachusetts Institute of Technology, Cambridge, MA (US)

(72) Inventors: Shumpei Ida, Nagaokakyo (JP); Hae-Seung Lee, Cambridge, MA (US)

(73) Assignees: MURATA MANUFACTURING CO., LTD., Nagaokakyo-Shi, Kyoto-Fu (JP); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 15/484,397

(22) Filed: Apr. 11, 2017

(65) Prior Publication Data
US 2018/0115303 A1 Apr. 26, 2018

Related U.S. Application Data

(63) Continuation of application No. PCT/US2014/061669, filed on Oct. 22, 2016.

(51) Int. Cl.
*H03F 3/04* (2006.01)
*H03H 11/46* (2006.01)
(Continued)

(52) U.S. Cl.
CPC ............ *H03H 11/53* (2013.01); *G01R 29/24* (2013.01); *H03F 3/45475* (2013.01);
(Continued)

(58) Field of Classification Search
CPC ....... G05F 3/242; G05F 3/30; A61B 5/04004; A61B 5/04012; A61B 5/0476;
(Continued)

(56) References Cited

U.S. PATENT DOCUMENTS 6,091,286 A 7/2000 Blauschild
6,664,844 B1 12/2003 Spiegel
(Continued)

FOREIGN PATENT DOCUMENTS

JP 08-509312 A 10/1996
JP 3833472 B2 10/2006
(Continued)

OTHER PUBLICATIONS

International Search Report issued in International Patent Application No. PCT/US2014/061669, dated Jan. 14, 2015.
(Continued)

*Primary Examiner* — Khanh V Nguyen
(74) *Attorney, Agent, or Firm* — Arent Fox LLP (57) ABSTRACT

A pseudo resistance circuit is disclosed that is capable of suppressing fluctuation in resistance value with fluctuation in process or temperature and facilitating adjustment. The pseudo resistance circuit includes a first MOSFET, a second MOSFET, a first current source which generates a first current substantially proportional to absolute temperature, and voltage source which generates a first voltage, which is a substantially linear function of absolute temperature. The gate of the first MOSFET and the gate of the second MOSFET are connected together, the second MOSFET is diode-connected, the first current is supplied to the drain of the second MOSFET, the first voltage is applied to the source of the second MOSFET, and a resistor having a resistance value according to the gate voltage of the first MOSFET is formed between the drain and the source of the first MOSFET.

16 Claims, 5 Drawing Sheets

(51) Int. Cl.
*G01R 29/24* (2006.01)
*H03F 3/45* (2006.01)
*H03F 3/343* (2006.01)
*G05F 3/26* (2006.01)
*H03F 3/345* (2006.01)
*G01R 1/20* (2006.01)

(52) U.S. Cl.
CPC .............. *G01R 1/203* (2013.01); *G05F 3/265* (2013.01); *H01L 2924/0002* (2013.01); *H03F 3/04* (2013.01); *H03F 3/343* (2013.01); *H03F 3/345* (2013.01)

(58) Field of Classification Search
CPC ... A61B 5/7203; H03F 1/26; H03F 2200/261; H03F 2200/294; H03F 2203/45288; H03F 3/45686
USPC .................................................. 330/257, 288
See application file for complete search history.

(56) References Cited

U.S. PATENT DOCUMENTS

| | | | |
|---|---|---|---|
| 6,696,895 B2* | 2/2004 | Tsukuda | H03F 3/3025 330/264 |
| 7,277,355 B2 | 10/2007 | Tanzawa | |
| 7,291,825 B2 | 11/2007 | Tsuruhara | |
| 7,324,035 B2* | 1/2008 | Harris | H03F 3/185 341/155 |
| 7,756,279 B2* | 7/2010 | Deruginsky | H03F 1/3211 330/259 |
| 7,944,271 B2 | 5/2011 | Illegems | |
| 7,957,215 B2 | 6/2011 | Tanzawa | |
| 8,183,947 B2* | 5/2012 | Casagrande | H03B 5/364 331/116 FE |
| 8,305,144 B1* | 11/2012 | Ferguson | H03F 3/45183 330/254 |
| 2003/0090324 A1* | 5/2003 | Tsukuda | H03F 3/3025 330/264 |
| 2003/0155966 A1* | 8/2003 | Harrison | H03F 1/086 330/9 |
| 2007/0047335 A1 | 3/2007 | Tanzawa | |
| 2008/0025121 A1 | 1/2008 | Tanzawa | |
| 2010/0045369 A1 | 2/2010 | Han | |
| 2010/0052840 A1 | 3/2010 | Fort et al. | |
| 2014/0049314 A1 | 2/2014 | Polley | |
| 2015/0054583 A1* | 2/2015 | Miyashita | H03G 3/00 330/285 |
| 2016/0020734 A1 | 1/2016 | Takase | |

FOREIGN PATENT DOCUMENTS

| | | |
|---|---|---|
| JP | 2007-59024 A | 3/2007 |
| JP | 2008-224230 A | 9/2008 |
| WO | WO 95/25349 A1 | 9/1995 |
| WO | 2014162952 A1 | 10/2014 |

OTHER PUBLICATIONS

Written Opinion of the International Searching Authority issued in International Patent Application No. PCT/US2014/061669, dated Jan. 14, 2015.

* cited by examiner

PSEUDO RESISTANCE CIRCUIT AND CHARGE DETECTION CIRCUIT

CROSS REFERENCE TO RELATED APPLICATIONS

The present application is a continuation of PCT/US2014/061669 filed Oct. 22, 2014, the entire contents of which are incorporated herein by reference.

FIELD OF THE INVENTION

The present invention relates to a pseudo resistance circuit and a charge detection circuit.

BACKGROUND OF THE INVENTION

As a sensor that is mounted in an electronic apparatus, a sensor that uses a charge detection circuit configured to output a voltage according to an electric charge output from a sensing element is known. For example, Patent Document 1 discloses a charge detection circuit in which a capacitor and a resistor connected in parallel are provided between an output terminal and an input terminal of an operational amplifier.

In a sensor using this charge detection circuit, in order to detect a signal having a comparatively low frequency (for example, about several mHz to several Hz), such as a biological signal, it is necessary to lower the cutoff frequency of a high-pass filter by a capacitor and a resistor. That is, it is necessary to increase the resistance value of the resistor (for example, to about 10 TΩ).

When increasing the resistance value of the resistor, the use of a typical resistive element is not practical in terms of circuit size. Accordingly, for example, Patent Document 2 discloses a configuration in which a weak inversion region of a MOSFET is used to form a resistor having a large resistance value.

However, one drawback when realizing a resistor using a weak inversion region of a MOSFET is that the resistance value fluctuates largely with fluctuation in process or temperature. For this reason, in realizing a resistor using a weak inversion region of a MOSFET, it is necessary to suppress the influence of fluctuation in process or temperature. For example, Patent Document 3 discloses a configuration in which the gate voltage of a MOSFET is adjusted using a plurality of current sources having temperature dependence, thereby suppressing temperature dependence of the drain current of the MOSFET.

Patent Document 1: Japanese Patent Application Laid-Open No. 2008-224230
Patent Document 2: International Publication No. 95/25349
Patent Document 3: PCT Japanese Translation Patent Publication No. 8-509312

In the configuration disclosed in Patent Document 3, in order to suppress temperature dependence of the drain current of the MOSFET, it is necessary to accurately set a plurality of parameters experimentally found, and adjustment is difficult.

SUMMARY OF THE INVENTION

The invention described herein has been accomplished in consideration of the limitations of the prior art, and an object of the invention is to provide a pseudo resistance circuit capable of suppressing fluctuation in resistance value with fluctuation in process or temperature and facilitating adjustment.

Accordingly, a pseudo resistance circuit according to an aspect of the invention is described that includes a first MOSFET, a second MOSFET, a first current source which generates a first current substantially proportional to absolute temperature, and a voltage source which generates a first voltage, which is a substantially linear function of absolute temperature, in which the gate of the first MOSFET and the gate of the second MOSFET are connected together, the second MOSFET is diode-connected, the first current is supplied to the drain of the second MOSFET, the first voltage is applied to the source of the second MOSFET, and a resistor having a resistance value according to the gate voltage of the first MOSFET is formed between the drain and the source of the first MOSFET.

According to the disclosure herein, it is possible to provide a pseudo resistance circuit capable of suppressing fluctuation in resistance value with fluctuation in process or temperature and facilitating adjustment.

It is noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION OF THE EXEMPLARY EMBODIMENTS

In the following description, for purposes of explanation only, specific nomenclature is set forth to provide a thorough understanding of the various embodiments described herein. However, it will be apparent to one skilled in the art that these specific details are not required to practice the concepts described herein.

Figure 1:
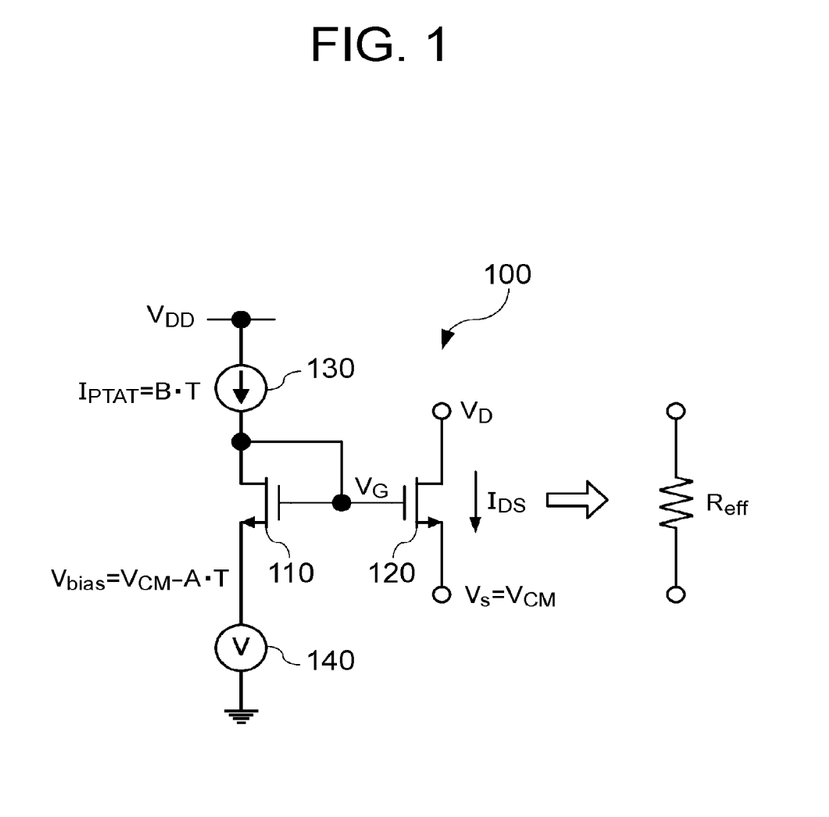
FIG. 1 is a diagram illustrating a configuration example of a pseudo resistance circuit according to an embodiment of the invention.

FIG. 1 is a diagram illustrating a configuration example of a pseudo resistance circuit according to an embodiment of the invention. A pseudo resistance circuit 100 includes N-channel MOSFETs 110 and 120, a current source 130, and a voltage source 140.

The N-channel MOSFET 110 (second MOSFET) is diode-connected, and the gate thereof is connected to the gate of the N-channel MOSFET 120. A current $I_{PTAT}$ from the current source 130 is supplied to the drain of the N-channel MOSFET 110. A voltage $V_{bias}$ from the voltage source 140 is applied to the source of the N-channel MOSFET 110.

The gate of the N-channel MOSFET 120 (first MOSFET) is connected to the gate of the N-channel MOSFET 110. In the pseudo resistance circuit 100, the N-channel MOSFET 120 operates in a weak inversion region, whereby a resistor having a resistance value $R_{eff}$ according to a gate voltage $V_G$ is formed between the drain and the source of the N-channel MOSFET 120.

The current source 130 generates the current $I_{PTAT}$ (first current) substantially proportional to absolute temperature. A configuration example of the current source 130 will be described below.

The voltage source 140 generates the voltage $V_{bias}$ (first voltage), which is a substantially linear function of absolute temperature. In this embodiment, if the source voltage $V_S$ of the N-channel MOSFET 120=$V_{CM}$, the relationship of $V_{bias}=V_{CM}-A \cdot T$ is established. Here, A is a constant, and T is absolute temperature. A configuration example of the voltage source 140 will be described below.

Figure 2:
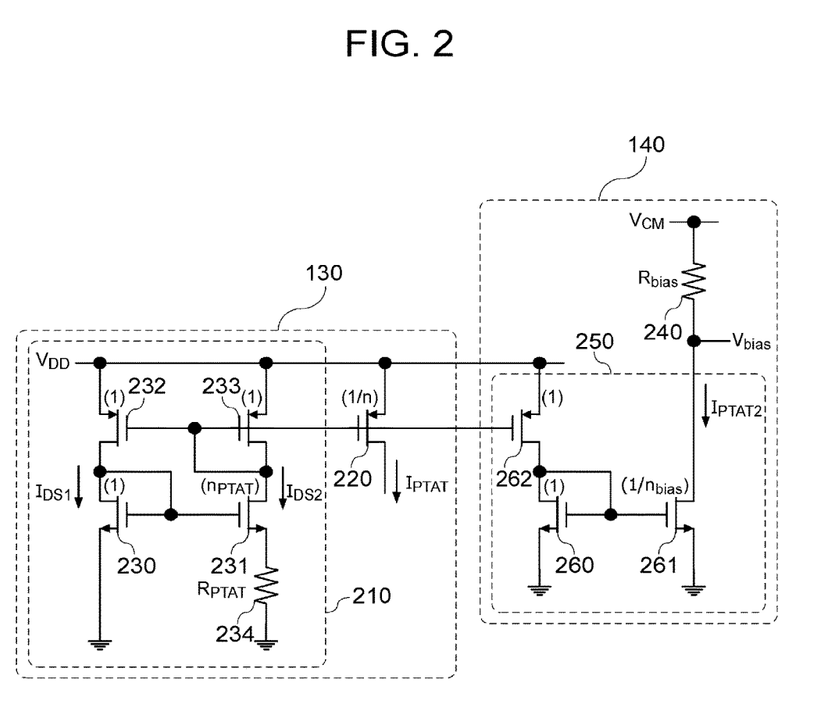
FIG. 2 is a diagram illustrating configuration examples of a current source and a voltage source of the circuit shown in FIG. 1.

FIG. 2 is a diagram illustrating configuration examples of the current source 130 and the voltage source 140 of the circuit 100 shown in FIG. 1.

As shown, the current source 130 includes a current source 210 and a P-channel MOSFET 220. In the current source 130, the current $I_{PTAT}$ is output from the drain of the P-channel MOSFET 220.

The current source 210 (third current source) includes N-channel MOSFETs 230 and 231, P-channel MOSFETs 232 and 233, and a resistor 234. An output current of the current source 210 is a current $I_{DS2}$ (third current) of the N-channel MOSFET 231.

As further shown, the N-channel MOSFET 230 is diode-connected, and the source thereof is grounded. The gate of the N-channel MOSFET 231 is connected to the gate of the N-channel MOSFET 230, and the source of the N-channel MOSFET 231 is grounded through the resistor 234. The size ratio of the N-channel MOSFETs 230 and 231 is, for example, 1:$n_{PTAT}$.

The P-channel MOSFET 232 is configured such that a power supply voltage $V_{DD}$ is applied to the source, the drain is connected to the drain of the N-channel MOSFET 230, and the gate is connected to the gate of the P-channel MOSFET 233. The P-channel MOSFET 233 is diode-connected and is configured such that the power supply voltage $V_{DD}$ is applied to the source, and the drain is connected to the drain of the N-channel MOSFET 231. The P-channel MOSFET 220 is configured such that the power supply voltage $V_{DD}$ is applied to the source, and the gate is connected to the gate of the P-channel MOSFET 233. The size ratio of the P-channel MOSFETs 232, 233, and 220 is, for example, 1:1:1/n.

In the current source 130, the gate-source voltage $V_{GS1}$ of the N-channel MOSFET 230 is expressed by Expression (1).

[Equation 1]

$$V_{GS1} = \frac{kT}{q}\frac{1}{\kappa}\ln\left(\frac{I_{DS1}}{I_{0S1}}\right) \quad (1)$$

Here, k is a Boltzmann constant, T is absolute temperature, q is an electronic charge, and κ is a κ approximated parameter. $I_{DS1}$ is a current which flows in the N-channel MOSFET 230, and $I_{0S1}$ is a current according to the size of the N-channel MOSFET 230.

The voltage $V_{GS1}$ is also the gate voltage of the N-channel MOSFET 231 and can be thus expressed by Expression (2).

[Equation 2]

$$V_{GS1} = V_{GS2} + I_{DS2}R_{PTAT} \quad (2)$$

Here, $V_{GS2}$ is the gate-source voltage of the N-channel MOSFET 231. $I_{DS2}$ is a current which flows in the N-channel MOSFET 231, that is, an output current of the current source 210. $R_{PTAT}$ is the resistance value of the resistor 234.

Expression (3) is derived from Expressions (1) and (2).

[Equation 3]

$$\frac{kT}{q}\frac{1}{\kappa}\ln\left(\frac{I_{DS1}}{I_{0S1}}\right) = \frac{kT}{q}\frac{1}{\kappa}\ln\left(\frac{I_{DS2}}{I_{0S2}}\right) + I_{DS2}R_{PTAT} \quad (3)$$

Here, $I_{0S2}$ is a current according to the size of the N-channel MOSFET 231.

$I_{DS2}$ is expressed by Expression (4).

[Equation 4]

$$I_{DS2} = \frac{1}{R_{PTAT}}\frac{kT}{q}\frac{1}{\kappa}\ln\left(\frac{I_{0S2}}{I_{0S1}}\right) = \frac{1}{R_{PTAT}}\frac{kT}{q}\frac{1}{\kappa}\ln(n_{PTAT}) \quad (4)$$

In the current source 130, a current which flows in the N-channel MOSFET 231 is $I_{DS2}$. The P-channel MOSFET 220 is connected to the P-channel MOSFET 233 in a current mirror configuration, and thus the current $I_{PTAT}$ is expressed by Expression (5).

[Equation 5]

$$I_{PTAT} = \frac{1}{n}I_{DS2} = \frac{1}{nR_{PTAT}}\frac{kT}{q}\frac{1}{\kappa}\ln(n_{PTAT}) = B \cdot T \quad (5)$$

Here, B is a constant. From Expression (5), the current $I_{PTAT}$ which is output from the current source 130 is a current which is substantially proportional to absolute temperature.

The voltage source 140 includes a resistor 240 and a current source 250. In the voltage source 140, the voltage $V_{bias}$ is output between the resistor 240 and the current source 250.

The resistor 240 (first resistor) is configured such that a voltage $V_{CM}$ (second voltage: the substantially same voltage as the source voltage of the N-channel MOSFET 120) is applied to one end, and the other end is connected to the drain of the N-channel MOSFET 261.

As further shown, the current source 250 (second current source) includes N-channel MOSFETs 260 and 261, and a P-channel MOSFET 262. In the current source 250, a current which flows in the N-channel MOSFET 261 becomes an output current $I_{PTAT2}$ (second current).

The N-channel MOSFET 260 is diode-connected and is configured such that the drain is connected to the drain of the P-channel MOSFET 262, and the source is grounded. The N-channel MOSFET 261 is configured such that the gate is connected to the gate of the N-channel MOSFET 260, and the source is grounded. The size ratio of the N-channel MOSFETs 260 and 261 is, for example, 1:1/$n_{bias}$.

The P-channel MOSFET 262 is configured such that the power supply voltage $V_{DD}$ is applied to the source, and the gate is connected to the gate of the P-channel MOSFET 233. The size ratio of the P-channel MOSFETs 233 and 262 is, for example, 1:1.

Similarly to the current source 130, the current source 250 generates the current $I_{PTAT2}$ substantially proportional to the absolute temperature. In this embodiment, $I_{PTAT2}=(1/n_{bias})I_{DS2}$. Accordingly, if the resistance value of the resistor 240 is $R_{bias}$, the voltage $V_{bias}$ is expressed by Expression (6).

[Equation 6]

$$V_{bias} = V_{CM} - R_{bias} I_{PTAT2} = V_{CM} - A \cdot T \qquad (6)$$

Here, A is a constant.

Next, the resistance value $R_{eff}$ in the pseudo resistance circuit 100 shown in FIG. 1 will be described.

Figure 3:
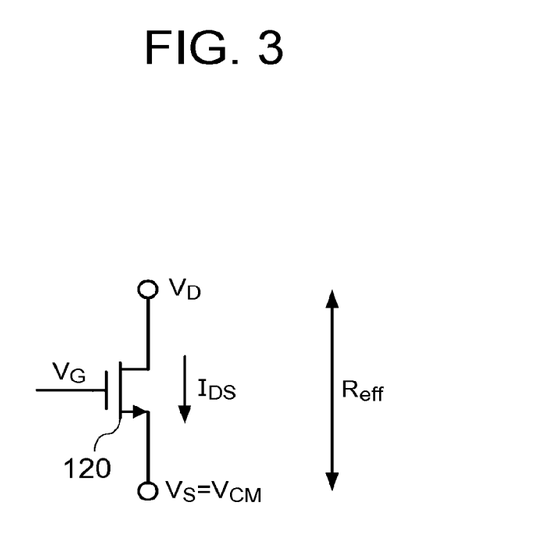
FIG. 3 is a diagram illustrating a resistance value when focusing only on an N-channel MOSFET.

First, as shown in FIG. 3, description will be provided focusing only on the N-channel MOSFET 120. When the N-channel MOSFET 120 operates in a weak inversion region, a current IDS which flows in the N-channel MOSFET 120 is expressed by Expression (7).

[Equation 7]

$$I_{DS} = I_{0S} \exp\left(\kappa \frac{qV_{GS}}{kT}\right)\left(1 - \exp\left(-\frac{qV_{DS}}{kT}\right)\right) \qquad (7)$$

Here, $V_{GS}$ is the gate-source voltage of the N-channel MOSFET 120, and $V_{DS}$ is the drain-source voltage of the N-channel MOSFET 120. $I_{OS}$ is a current according to the size of the N-channel MOSFET 120 and is expressed by Expression (8).

[Equation 8]

$$I_{0S} = \mu C_{ox} \frac{W}{L}\left(\frac{kT}{q}\right)^2 \frac{1-\kappa_{sa}}{\kappa_{sa}} \exp\left(-\kappa \frac{qV_{TS}}{kT}\right) \qquad (8)$$

Here, μ is electron mobility, $C_{ox}$ is oxide capacity per unit area, W is a channel width, L is a channel length, and $\kappa_{sa}$ is a κ approximated parameter in a weak inversion region. $V_{TS}$ is a threshold voltage.

From Expressions (7) and (8), the resistance value $R_{eff}$ between the drain and the source of the N-channel MOSFET 120 is expressed by Expression (9).

[Equation 9]

$$R_{eff} = \qquad (9)$$
$$\left(\frac{dI_{DS}}{dV_{DS}}\right)^{-1} = \frac{1}{\mu C_{ox}} \frac{L}{W} \frac{q}{kT} \frac{\kappa_{sa}}{1-\kappa_{sa}} \exp\left[\frac{q}{kT}\{\kappa V_{TS} - \kappa(V_G - V_{CM} + V_{DS})\}\right]$$

Expression (9) includes temperature T. Expression (9) also includes a threshold voltage $V_{TS}$ which fluctuates with a process. Accordingly, in the pseudo resistance circuit 100 of this embodiment, as described below, fluctuation in resistance value $R_{eff}$ with fluctuation in process and temperature is suppressed by the current source 130 and the voltage source 140.

Figure 4:
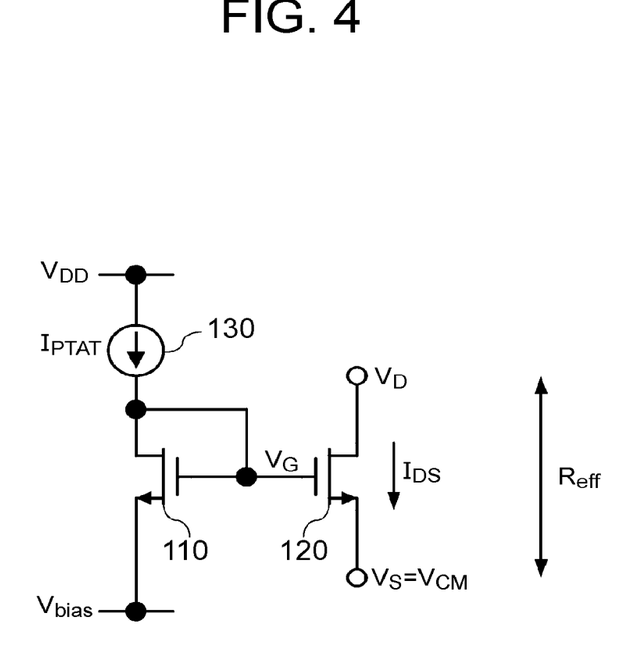
FIG. 4 is a diagram illustrating a resistance value when focusing on an N-channel MOSFET and a current source.

First, as shown in FIG. 4, description will be provided focusing on the action of the current source 130. When the N-channel MOSFET 120 operates in a weak inversion region, the voltage $V_G$ is expressed by Expression (10).

[Equation 10]

$$V_G = \frac{kT}{q}\frac{1}{\kappa}\ln\left(\frac{I_{PTAT}}{I_{0S}}\right) + V_{bias} \qquad (10)$$

In Expression (7), since $V_{GS}=V_G-V_{CM}$, if $V_G$ of Expression (10) is substituted in Expression (7), the current IDS is expressed by Expression (11).

[Equation 11]

$$I_{DS} = I_{PTAT}\exp\left\{\kappa\frac{q}{kT}(V_{bias}-V_{CM})\right\}\left\{1-\exp\left(-\frac{q}{kT}V_{DS}\right)\right\} \qquad (11)$$

From Expression (11), the resistance value $R_{eff}$ is expressed by Expression (12).

[Equation 12]

$$R_{eff} = \frac{kT}{q}\frac{1}{I_{PTAT}}\exp\left[\frac{q}{kT}\{V_{DS}+\kappa(V_{CM}-V_{bias})\}\right] \qquad (12)$$

If the current $I_{PTAT}$ of Expression (5) is substituted in Expression (12), the resistance value $R_{eff}$ is expressed by Expression (13).

[Equation 13]

$$R_{eff} = \frac{k}{q}\cdot\frac{1}{B}\exp\left[\frac{q}{kT}\{V_{DS}+\kappa(V_{CM}-V_{bias})\}\right] \qquad (13)$$

Expression (13) does not include the threshold voltage $V_{TS}$. More specifically, due to the action of the current source 130, the influence of fluctuation in process on the resistance value $R_{eff}$ is suppressed. However, Expression (13) still includes temperature T. In this embodiment, with the action of the voltage source 140, fluctuation in resistance value $R_{eff}$ with fluctuation in temperature is suppressed.

If $V_{bias}$ of Expression (6) is substituted in Expression (13), the resistance value $R_{eff}$ is expressed by Expression (14).

[Equation 14]

$$R_{eff} = \frac{k}{q}\cdot\frac{1}{B}\exp\left[\frac{q}{kT}\{V_{DS}+\kappa\cdot A\cdot T\}\right] \qquad (14)$$

Here, in the N-channel MOSFET 120, Expression (15) is assumed.

[Equation 15]

$$V_{DS} \approx 0 \qquad (15)$$

Accordingly, from Expression (14) and Expression (15), the resistance value $R_{eff}$ is expressed by Expression (16).

[Equation 16]

$$R_{eff} = \frac{k}{q}\cdot\frac{1}{B}\exp\left(\frac{q}{k}\kappa A\right) \qquad (16)$$

The voltage $V_{bias}$ can be expressed by Expression (17).

[Equation 17]

$$V_{bias} = V_{CM} - R_{bias}I_{PTAT2} \qquad (17)$$
$$= V_{CM} - R_{bias}\frac{1}{n_{bias}R_{PTAT}}\frac{kT}{q}\frac{1}{\kappa}\ln(n_{PTAT})$$

Accordingly, considering Expression (5) and Expression (17), the resistance value $R_{eff}$ may be expressed by Expression (18).

[Equation 18]

$$R_{eff} = \frac{nR_{PTAT}}{\ln(n_{PTAT})} \exp\left\{ \frac{q}{kT} V_{DS} + \frac{\kappa R_{bias}}{n_{bias} R_{PTAT}} \ln(n_{PTAT}) \right\} \quad (18)$$

Then, applying Expression (15), the resistance value $R_{eff}$ can be expressed by Expression (19).

[Equation 19]

$$R_{eff} = \frac{nR_{PTAT}}{\ln(n_{PTAT})} \exp\left\{ \frac{\kappa R_{bias}}{n_{bias} R_{PTAT}} \ln(n_{PTAT}) \right\} \quad (19)$$

Expression (16) and Expression (19) do not include the threshold voltage $V_{TS}$ and temperature T. Accordingly, in the pseudo resistance circuit 100 shown in FIG. 1, fluctuation in resistance value $R_{eff}$ with fluctuation in process and temperature is suppressed by the current source 130 and the voltage source 140.

As described above, in the pseudo resistance circuit 100 of this embodiment, as shown in Expression (13), it is possible to suppress fluctuation in resistance value $R_{eff}$ with fluctuation in process by the current source 130 which generates the current $I_{PTAT}$ substantially proportional to absolute temperature and the voltage source 140 which generates the voltage $V_{bias}$, which is a substantially linear function of absolute temperature.

In the pseudo resistance circuit 100 of the exemplary embodiment as shown in FIG. 1, the voltage $V_{bias}$ generated by the voltage source is substantially equal to the source voltage of the N-channel MOSFET 120 at absolute zero (that is, $V_{bias} = V_{CM} - A \cdot T$), whereby it is possible to suppress fluctuation in resistance value $R_{eff}$ with fluctuation in temperature.

Accordingly, in the pseudo resistance circuit 100, in order to suppress fluctuation in resistance value $R_{eff}$ with fluctuation in process or temperature, it is not necessary to accurately set a plurality of parameters experimentally found, and adjustment is facilitated.

In the pseudo resistance circuit 100 of the exemplary embodiment, the current generation in the current source 130 and the current source 250 is performed based on the same current source 210. Accordingly, as shown in Expression (19), it is possible to adjust the resistance value $R_{eff}$ by the resistance ratio and the current ratio in the current source 130 and the current source 250.

Figure 5:
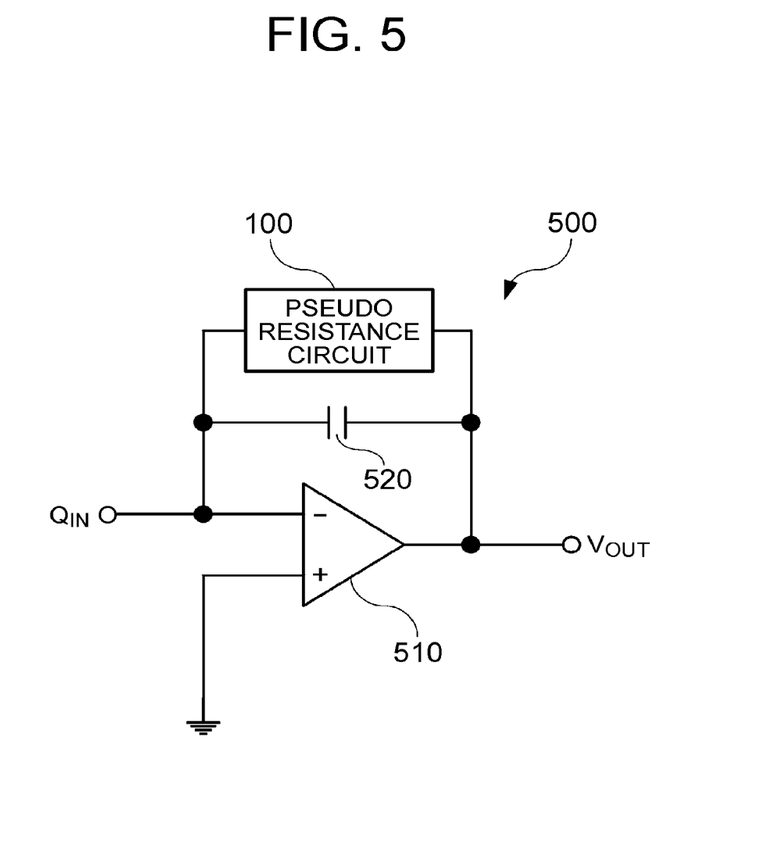
FIG. 5 is a diagram illustrating a configuration example of a charge detection circuit according to an embodiment of the invention.

FIG. 5 is a diagram illustrating an example of a charge detection circuit according to an exemplary embodiment. A charge detection circuit 500 includes the pseudo resistance circuit 100 shown in FIG. 1, an operational amplifier 510, and a capacitor 520.

The operational amplifier 510 is configured such that the non-inverting input terminal is grounded, and an electric charge $Q_{IN}$ is input to the inverting input terminal. The electric charge $Q_{IN}$ is, for example, an electric charge which is output from a sensing element. The pseudo resistance circuit 100 is connected between the output terminal and the inverting input terminal of the operational amplifier 510. The capacitor 520 is connected in parallel with the pseudo resistance circuit 100.

The charge detection circuit 500 outputs an output voltage $V_{OUT}$ according to the electric charge $Q_{IN}$ input to the inverting input terminal from the output terminal of the operational amplifier 510. In the charge detection circuit 500, the pseudo resistance circuit 100 uses a weak inversion region of a MOSFET making it possible for the resistance value of the pseudo resistance circuit 100 to be a large value of, for example, about 10 TΩ. Accordingly, the charge detection circuit 500 is suitable for detecting a signal having a comparatively low frequency, such as a biological signal. As described above, in the pseudo resistance circuit 100, fluctuation in resistance value with fluctuation in process or temperature is suppressed. Accordingly, it becomes possible to suppress fluctuation in the output voltage of the charge detection circuit 500 with fluctuation in process or temperature.

Although various embodiments have been described with respect to specific examples and subsystems, it will be apparent to those of ordinary skill in the art that the embodiment is simply for ease of understanding of the invention, and is not in any way to be construed as limiting the invention. The invention may be altered or improved without departing from the spirit and encompass equivalents thereof.

DESCRIPTION OF REFERENCE NUMERALS

100: pseudo resistance circuit
110, 120, 230, 231, 260, 261: N-channel MOSFET
130, 210, 250: current source
140: voltage source
220, 232, 233, 362: P-channel MOSFET
234, 240: resistor
500: charge detection circuit
510: operational amplifier
520: capacitor

The invention claimed is:

1. A pseudo resistance circuit comprising:
a first MOSFET having a drain, a source and a gate;
a second MOSFET having a drain, a source and a gate that is coupled to the gate of the first MOSFET, the second MOSFET being diode-connected;
a first current source coupled to the drain of the second MOSFET and configured to generate a first current substantially proportional to absolute temperature; and
a voltage source coupled to the source of the second MOSFET and configured to generate a first voltage, which is a substantially linear function of absolute temperature,
wherein a resistor is formed between the drain and the source of the first MOSFET that has a resistance value based on the gate voltage of the first MOSFET.

2. The pseudo resistance circuit according to claim 1, wherein the first voltage generated by the voltage source is substantially equal to the source voltage of the first MOSFET at absolute zero.

3. The pseudo resistance circuit according to claim 2, wherein the voltage source includes:
a first resistor having a first end and a second end where a second voltage is applied to the first end of the first resistor; and
a second current source coupled between the second end of the first resistor and ground, the second current source being configured to generate a second current that is substantially proportional to absolute temperature.

4. The pseudo resistance circuit according to claim 3, wherein the voltage source is configured to output the first voltage on the second end of the first resistor.

5. The pseudo resistance circuit according to claim 4, wherein the first current source includes a third current source configured to generate a third current substantially proportional to absolute temperature.

6. The pseudo resistance circuit according to claim 5, wherein the first current source generates the first current based on the third current.

7. The pseudo resistance circuit according to claim 6, wherein the second current source generates the second current based on the third current.

8. The pseudo resistance circuit according to claim 7, wherein the second current source comprises:
a third MOSFET having a drain, a source and a gate;
a fourth MOSFET that is diode connected with a drain coupled to the drain of the third MOSFET and a source coupled to ground; and
a fifth MOSFET with gate coupled to a gate of the fourth MOSFET, a drain coupled to the second end of the first resistor, and a source coupled to ground.

9. The pseudo resistance circuit according to claim 1, wherein the first current source comprises:
a third MOSFET having a drain, a source and a gate;
a fourth MOSFET having a drain, a source and a gate;
a fifth MOSFET having a drain, a source and a gate; and
a sixth MOSFET having a drain, a source and a gate.

10. The pseudo resistance circuit according to claim 9, wherein a power supply voltage is applied to the source of the third MOSFET.

11. The pseudo resistance circuit according to claim 10, wherein the fourth MOSFET is diode connected with the drain of the fourth MOSFET coupled to the drain of the third MOSFET.

12. The pseudo resistance circuit according to claim 11, wherein the fifth MOSFET is diode connected with the power supply voltage applied to the source of the fifth MOSFET and the gate of the fifth MOSFET coupled to the gate of the third MOSFET.

13. The pseudo resistance circuit according to claim 12, wherein the drain of the sixth MOSFET is coupled to the drain of the fifth MOSFET, the gate of the sixth MOSFET is coupled to the gate of the fourth MOSFET, and the source of the sixth MOSFET is coupled to a first resistor that is coupled to ground.

14. A charge detection circuit comprising:
the pseudo resistance circuit according to claim 1;
a capacitor connected in parallel with the resistor of the pseudo resistance circuit; and
an operational amplifier having an output terminal coupled to a first end of the resistor and to a first end of the capacitor and an inverting input terminal coupled to a second end of the resistor and to a second end of the capacitor.

15. The charge detection circuit according to claim 14, wherein a voltage, based on an electric charge input to the inverting input terminal of the operational amplifier, is output from the output terminal of the operational amplifier.

16. The charge detection circuit according to claim 14, wherein a non-inverting input of the operational amplifier is coupled to ground.

* * * * *

UNITED STATES PATENT AND TRADEMARK OFFICE
CERTIFICATE OF CORRECTION

PATENT NO. : 10,187,041 B2
APPLICATION NO. : 15/484397
DATED : January 22, 2019
INVENTOR(S) : Shumpei Ida and Hae-Seung Lee Page 1 of 1

It is certified that error appears in the above-identified patent and that said Letters Patent is hereby corrected as shown below:

On the Title Page

Item (63) Under Related U.S. Application Data it reads as:
Continuation of application No. PCT/US2014/061669, filed on Oct. 22, 2016
And should read as:
Continuation of application No. PCT/US2014/061669, filed on Oct. 22, 2014

Signed and Sealed this
Fifth Day of March, 2019

Andrei Iancu
*Director of the United States Patent and Trademark Office*